(12) United States Patent
Brcka

(10) Patent No.: US 7,464,662 B2
(45) Date of Patent: Dec. 16, 2008

(54) COMPACT, DISTRIBUTED INDUCTIVE ELEMENT FOR LARGE SCALE INDUCTIVELY-COUPLED PLASMA SOURCES

(75) Inventor: Jozef Brcka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 41 days.

(21) Appl. No.: 10/766,505

(22) Filed: Jan. 28, 2004

(65) Prior Publication Data

US 2005/0160985 A1 Jul. 28, 2005

(51) Int. Cl.
C23C 16/00 (2006.01)
C23F 1/00 (2006.01)
H01L 21/306 (2006.01)

(52) U.S. Cl. ............................. 118/723 I; 156/345.48
(58) Field of Classification Search ............ 156/345.48; 118/722, 723 R, 723 I
See application file for complete search history.

(56) References Cited

U.S. PATENT DOCUMENTS

| | | | |
|---|---|---|---|
| 5,304,279 A | 4/1994 | Coultas et al. | |
| 5,435,881 A | 7/1995 | Ogle | |
| 5,650,032 A * | 7/1997 | Keller et al. ............ | 156/345.48 |
| 5,998,933 A | 12/1999 | Shun'ko | |
| 6,080,287 A | 6/2000 | Drewery et al. | |
| 6,089,182 A * | 7/2000 | Hama .................. | 118/723 I |
| 6,158,384 A | 12/2000 | Ye et al. | |
| 6,237,526 B1 | 5/2001 | Brcka | |
| 6,268,700 B1 | 7/2001 | Holland et al. | |
| 6,338,313 B1 | 1/2002 | Chan | |
| 6,451,161 B1 | 9/2002 | Jeng et al. | |
| 6,459,066 B1 * | 10/2002 | Khater et al. ......... | 219/121.41 |
| 6,474,256 B1 | 11/2002 | Vogel | |
| 6,474,258 B2 | 11/2002 | Brcka | |
| 2002/0170677 A1 | 11/2002 | Tucker et al. | |
| 2003/0015965 A1 | 1/2003 | Godyak | |
| 2003/0117321 A1 * | 6/2003 | Furse et al. ........... | 343/700 MS |

OTHER PUBLICATIONS

Serpentine. The American Heritage® Dictionary of the English Language (2003). Retrieved Oct. 12, 2006, from xreferplus. http://www.xreferplus.com/entry/4130596.*

* cited by examiner

Primary Examiner—Parviz Hassanzadeh
Assistant Examiner—Maureen G Arancibia
(74) Attorney, Agent, or Firm—Wood, Herron & Evans, L.L.P.

(57) ABSTRACT

An inductively coupled plasma source is provided with a compact inductive element that is configured to produce a spatially distributed plasma particularly suitable for processing large scale wafers. The element in its preferred embodiment is formed of a sheet material for compactness and ease in configuring. The element is located outside of a dielectric wall or window of a processing chamber, generally congruent to the dielectric wall or window, formed of one or more layers or loops. The conductor provides a conductive path around each loop that has a serpentine or oscillating configuration that renders the path around each loop greater than the circumference of the element. The path is so shaped by cutouts along the side edges of the element. The conductor is formed of alternating sections of large and small aspect ratio, defined as the width across the path to the thickness of the sheet. The sections are also defined by cutouts in the sheet. Narrower sections concentrate currents, have higher inductances, and couple greater amounts of energy into the chamber, thereby producing rings of discrete plasma concentrations. One or more rings can be produced by configuring one or more loops of the inductive element so the higher inductance, lower aspect ratio sections lie at appropriate radii from the axis of the chamber.

14 Claims, 9 Drawing Sheets

COMPACT, DISTRIBUTED INDUCTIVE ELEMENT FOR LARGE SCALE INDUCTIVELY-COUPLED PLASMA SOURCES

This invention relates to high-density plasma generating devices, systems and processes, particularly for the manufacture of semiconductor wafers. This invention particularly relates to the high density inductively coupled plasma sources used in semiconductor processing.

BACKGROUND OF THE INVENTION

There are two principal groups of the plasma sources: capacitively coupled plasma sources, which utilize RF electric field coupling to the plasma, and inductively coupled plasma (ICP) sources, which utilize RF magnetic field coupling to the plasma. Inductively coupled plasma (ICP) sources are commonly recognized as the most convenient and cost effective for plasma generation for plasma processing in semiconductor technology. The operation of the ICP is based on the principle of electromagnetic induction, in which RF current driven in a coil induces an electromagnetic RF field inside a vacuum chamber, ignites a plasma and sustains the plasma by induced RF plasma current. Currently the most common inductively coupled sources (ICP) have coils with a planar, cylindrical or dome-shaped geometries consisting of several loops to provide sufficient RF power into plasma.

Recently, antennae with more complex shapes have been proposed, for example, combined (hybrid) or dual coil configurations, coils generating torroidal plasmas, embedded coils, planar helicon (serpentine) antennae, 3D antennae, or parallel conductor antennae. A very common problem in ICPs for large area processing is relatively large radial plasma non-uniformity due to plasma diffusion to the walls of the chamber. Also, a significant problem is azimuthal plasma non-uniformity caused by the transmission line effects along the coil conductor, which are due to current non-uniformity along the coil length.

To improve plasma uniformity, more complex structures consisting of the multiple spirals connected in parallel and powered from common RF power sources have been proposed. However, tendencies to develop plasma instabilities have been observed in such configurations, thus generating even more inhomogeneity in a plasma.

Alternative approaches for ICP utilizing ferrite core transformers having a primary winding connected to an RF power source and a secondary winding being provided by a current conducting plasma have been proposed. But mechanical supports and arrangements, cooling of the individual inductors, and materials compatibility with process chemistry have made these concepts too complicated and impractical for high-density plasma applications, where proper and final solutions would be too costly. These facts have encouraged a search for alternative and simple solutions.

Subsequently, a planar low inductance coil has been proposed, in which an RF induction coil having a large surface area and a low profile has resulted in effective RF power coupling to the large load. Preferably, the turns of the coil comprise sheets of metal and the coil turns are substantially parallel to each other. However, it appears that the most effective power deposition into the plasma with such a coil occurs at a radius rather close to the inside of the coil, so the coil may not provide large size uniform plasma, but rather a center-peaked plasma density distribution. Consequently, a similar power density distribution can be achieved with significantly smaller spiral coil.

Accordingly, there is a need for an ICP source that produces a high density uniform plasma that is simple and low in cost.

SUMMARY OF THE INVENTION

An objective of the present invention is to provide an inductive device that can be utilized in a large area plasma source to generate uniformly distributed plasma. Another objective of the invention is to provide a low inductance inductive device for such a source. A further objective of the invention is to provide a compact, efficient and low cost plasma source.

According to principles of the present invention, an ICP source is provided with an inductive element configured to couple spatially distributed RF power into a plasma. The element includes one or more conductors of one or more layers or turns that is shaped into sections. Such conductors have varying cross-sections and varying aspect ratios along their lengths, producing sections or segments of differing current densities that are positioned relative to each other and relative to the space in a vacuum chamber at which plasma is generated to produce a desired distribution of power.

Embodiments of the invention provide an inductive element that is located outside of and generally congruent with a dielectric vacuum chamber wall. The inductor has a current path that is longer than the circumferential extent of the element, the path and the cross-sectional variations along the length of the element being determined by variations in the shapes of the peripheral side edges of the element around the chamber. The path, in various embodiments, oscillates between different radii as it circles the axis of the chamber, passing through differently dimensioned segments throughout each oscillation. This configuration allows for distributions of plasma density among inner, outer or intermediate rings, in various combinations.

In certain embodiments of the invention, inductors are formed of generally flat, sheet-like, highly electrically-conductive material configured to produce a current path of varying cross-sectional area, particularly by being formed to different widths. The conductor shape is determined by cut-outs formed in the sheet material and arranged to produce narrow and wide conductor segments. Typically, the narrow segments result in locally higher RF current concentrations in the conductor, which result in locally higher magnetic fields. When positioned close to a dielectric wall of a vacuum chamber, such a conductor outside of the chamber couples high density power into the vacuum chamber opposite the dielectric wall or window. By designing the distribution of the low aspect ratio or narrow sections, a segmented power distribution is coupled into the chamber in an array of high intensity locations which, when integrated, produce a controllable plasma uniformity.

According to illustrated embodiments of the invention, high electrical-conductivity sheet material is formed into an inductive element that is congruent with the dielectric wall or window of a vacuum chamber. An array of cut-outs is formed into the material to produce wide and narrow conductor sections. These sections can be designed to lie at different radii to produce concentrated or wide plasma distributions, or they can be otherwise spaced to shape the distribution to provide some desired effect on the process, such as uniform processing of the substrate.

Various configurations that are particularly advantageous for chambers of different shapes are provided. These different shaped chambers are defined in part by dielectric walls that are planar, cylindrical, hemispherical, conical or other shapes.

The present invention provides an inductively coupled plasma source suitable for a variety of tasks in plasma processing technology, providing distributed uniform plasma over a large processing area. The source is provided with a low impedance inductive element that is economical to make and can be easily configured to produce a desired plasma density distribution.

These and other objectives and advantages of the present invention will be more readily apparent from the following detailed description.

DETAILED DESCRIPTION

Figure 1:
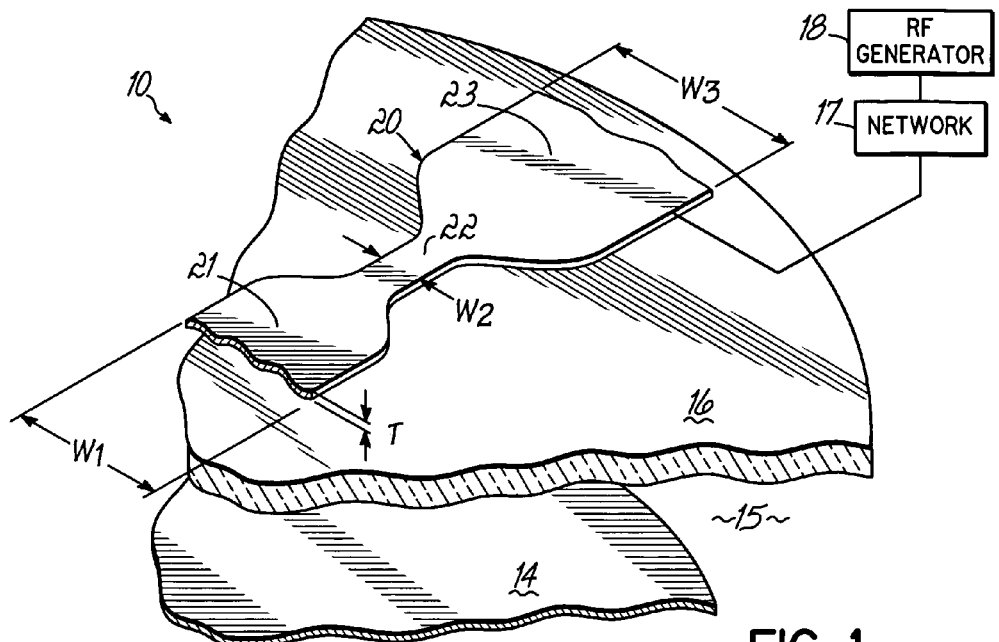
FIG. 1 is a perspective cut-away diagram of a section of an ICP processing apparatus showing a representative length of an inductive element according to principles of the present invention.
Figure 1A:
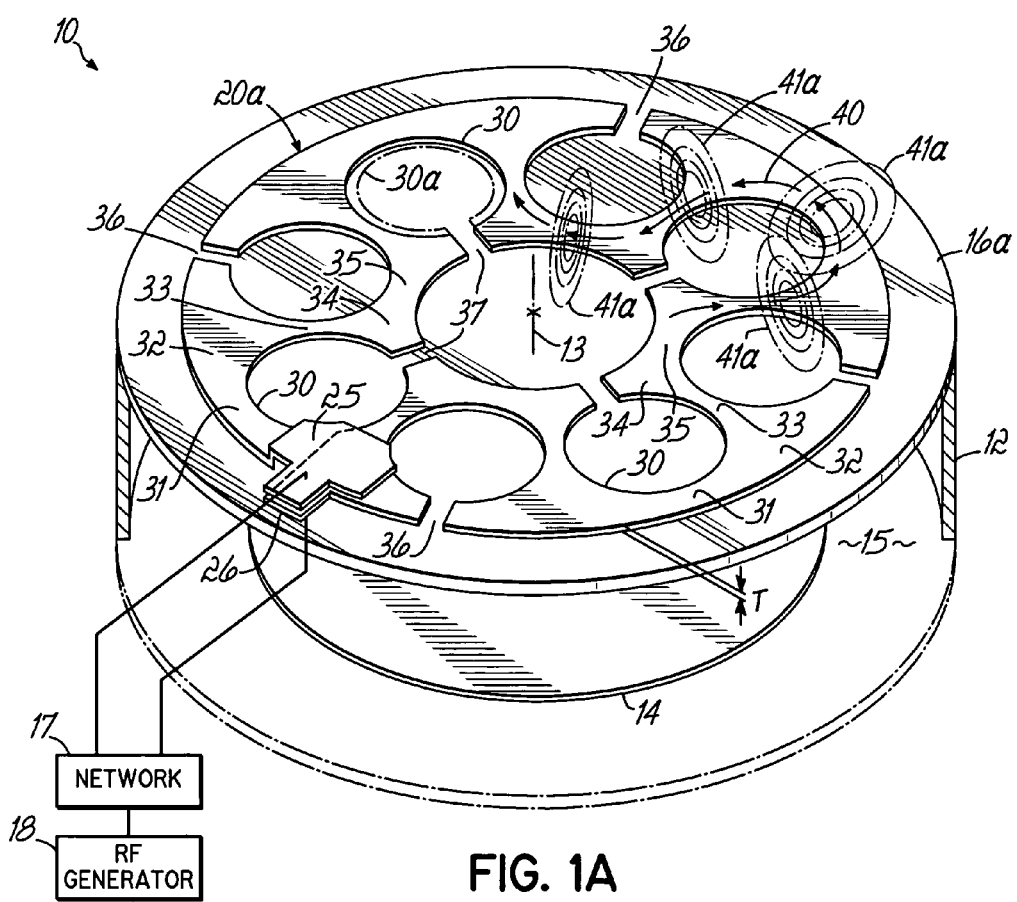
FIG. 1A is a perspective diagram, partially broken away, illustrating an embodiment of the apparatus of FIG. 1 and having a four-segment, single loop, generally flat inductive element according to an embodiment of the invention.

FIG. 1 shows a cut-away portion of a semiconductor wafer processing apparatus 10, for example, an ionized physical vapor deposition (iPVD) apparatus as described in U.S. Pat. Nos. 6,080,287 or 6,287,435, or an etching apparatus as described in U.S. Pat. No. 6,652,711, each hereby expressly incorporated herein by reference. FIG. 1A is a perspective diagram of an embodiment of an apparatus 10 of FIG. 1. Such an apparatus 10 includes a vacuum processing chamber 12 in which is supported a semiconductor wafer or other substrate 14 for processing. The apparatus 10 includes a chamber wall either formed of a dielectric material, such as alumina or quartz for example, or having a dielectric window 16 formed therein. Behind the dielectric window 16, outside of the chamber, is provided an RF energy source (not shown in its entirety) having an inductive element or antenna 20, coupled to an RF generator 18 through a matching network 17. The generator 18 commonly operates at the industrial frequency of 13.56 MHz to supply energy through the antenna 20 from which it is inductively coupled into the chamber 12 to form a high density plasma 15 therein for processing the substrate 12.

According to principles of the present invention, the antenna 20 is an inductive element having multiple segments, shown in FIG. 1 as segments 21-23, with differing geometries selected to produce a low-inductance inductive element that will couple energy in a controlled distribution into the chamber 12 that extends over a large area to produce the plasma 15. Such an inductive element 20 is capable of being configured to produce a large area plasma for processing wafers having diameters of 200 and 300 millimeters with ion flux distributions of improved uniformities. The inductive element 20 is formed of a sheet of highly conductive material, such as copper or a silver-clad metal, which is illustrated as a uniform thickness T, but which may vary in width. The multiple segments 21-23 may geometrically differ from each other, and the segments 21-23 are shown having differing widths $W_1$, $W_2$ and $W_3$, respectively.

In general, the widths $W_1$, $W_2$ and $W_3$ of the sections 21-23 are greater than the thickness T, so that each section may be considered as having an "aspect ratio", defined for purposes of this description as being the ratio of W to T, where W is the width $W_1$, $W_2$ or $W_3$ of the respective section 21-23. The antenna 20, is arranged in the apparatus 10 so that it is parallel to, or more generally congruent to, the dielectric window or wall 16, such that the dimension T of each section is locally perpendicular to the window 16 and the respective width $W_1$, $W_2$ or $W_3$ of each section is locally parallel to the window 16. As such, the longitudinal extent of the conductor of the antenna 20, which is perpendicular to the plane of T and W, is also locally parallel to the window 16. Examples of different arrangements of the inductive element 20 are illustrated in FIGS. 1A-1C, including, respectively, a planar inductive element 20a, a cylindrical inductive element 20b, and a hemispherical inductive element 20c.

Referring to FIG. 1A, an embodiment 20a of the inductive element 20 is illustrated. The inductive element 20a is formed of a large aspect ratio conductor that is arranged parallel to the dielectric wall 16a that is in the form of a flat, circular window in an otherwise metallic chamber wall of the plasma chamber 12 (FIG. 1). In the case of the planar chamber wall 16a, which might be, for example, the top end of a cylindrical chamber, the inductive element 20a is formed of a wide annular strip of metal, which may be centered concentrically about the axis 13 of the chamber 12. The annular sheet that forms the element 20a is split along its radius at one point on its circumference, providing ends 25,26 of the conductor of the element 20 that may, but need not, overlap, as shown. These ends 25,26 are connected to output terminals of the matching network 17, which is connected across output terminals of RF generator 18, which energizes the element 20a.

Figure 1B:
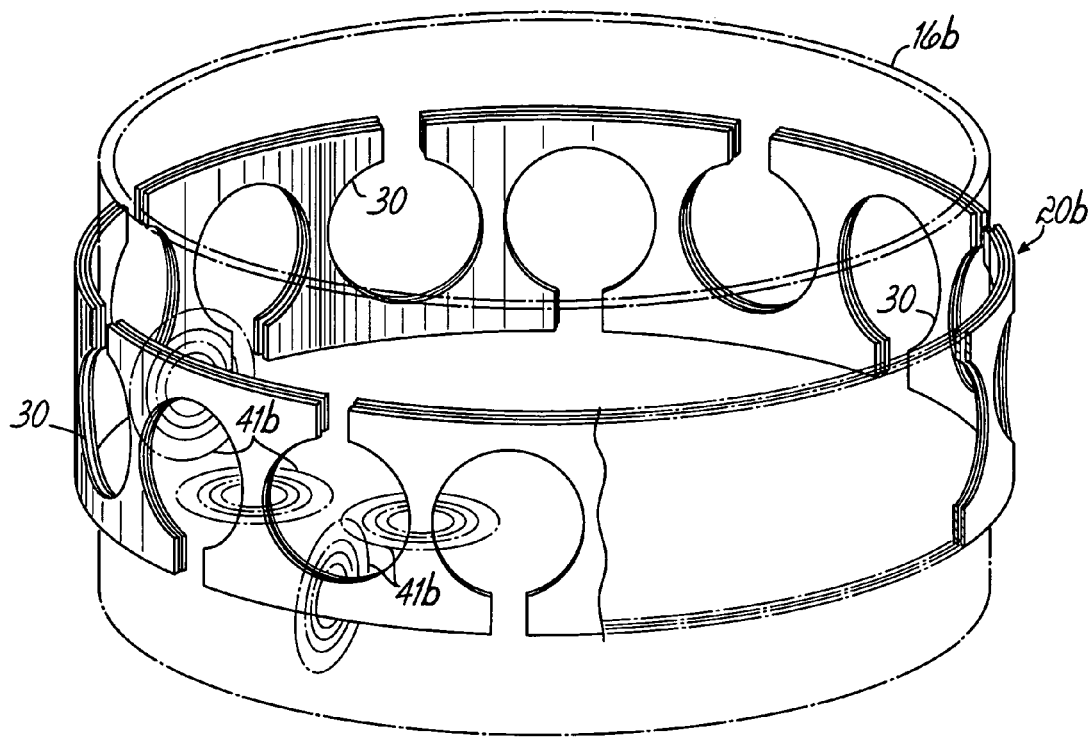
FIG. 1B is a partially broken away perspective diagram illustrating an embodiment of an ICP apparatus, similar to FIG. 1A, having an eight-segment, double loop, generally cylindrical inductive element according to another embodiment of the invention.
Figure 1C:
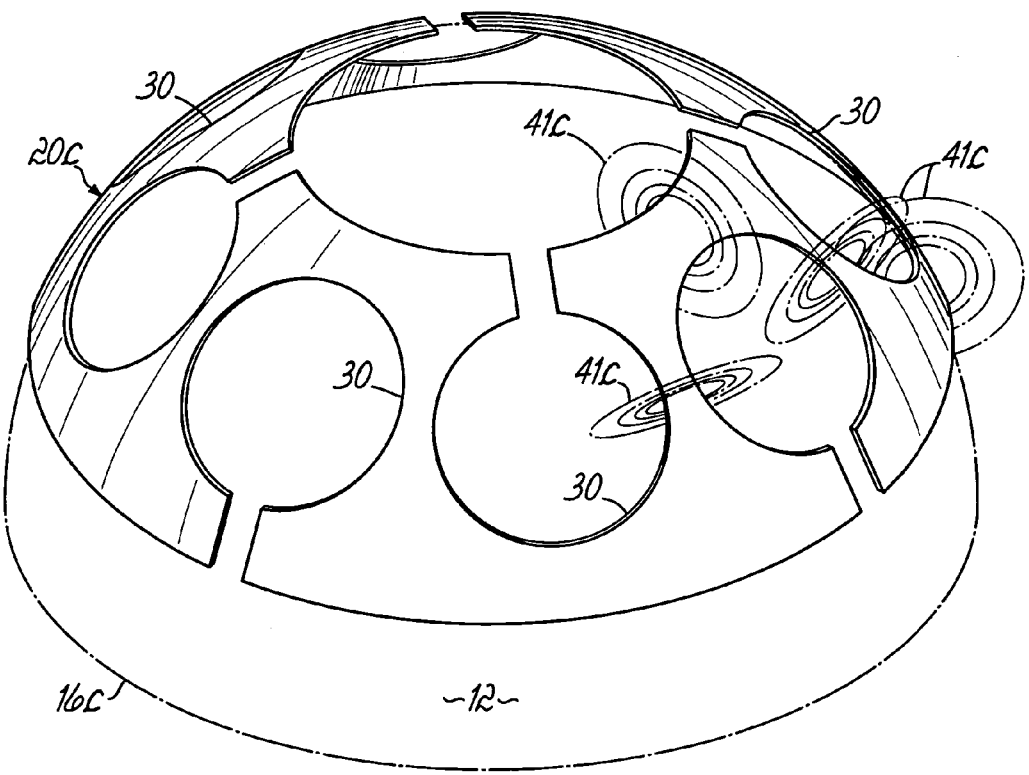
FIG. 1C is a partially broken away perspective diagram illustrating an embodiment of an ICP apparatus, similar to FIGS. 1A and 1B, having a four-segment, generally spherical embodiment of an inductive element according to another embodiment of the invention.

In FIG. 1B, an inductive element 20b is provided that is cylindrical and surrounds the generally cylindrical dielectric wall or window 16b of a chamber, while in FIG. 1C, an inductive element 20c is provided that is domed or generally spherical in shape, and congruent to a generally spherical dielectric chamber wall 16c. Such a shape may be extrapolated to include a conical shape, and other shapes may be employed. Such elements 20b, 20c also have high aspect ratios and are oriented so as to be congruent with the chamber walls having such shapes.

Typical aspect ratios of the conductor of the inductive elements 20 can vary. Aspect ratios of from 5:1 up to 100:1 are useful, but greater or lesser ratios may be employed.

With respect to all of the embodiments of FIGS. 1A-1C, to distribute locations of the plasma generation inside the chamber 12, the metallic sheets or strips of which the conductor of the inductive element 20 is formed are shaped to have different aspect ratio segments, such as segments 21-23 (FIG. 1). The shapes of the segments 21-23 are defined by cut-outs 30 (FIG. 1A), thereby creating a sequence of higher and lower aspect ratio conductor sections 31-35, and forming gaps 36 and 37 that interrupt the shortest paths for RF current to flow through the element 20a. In this fashion, inductive loops 40 are generated where increased RF current density occurs, thus causing stronger RF magnetic fields to couple locally through the window 16a and into the vacuum chamber 12. Openings formed by circular cut-outs 30, as illustrated, provide easy RF magnetic field penetration into the plasma 13 and generate closed magnetic loops 41a. It is preferred that the cut-out patterns have smooth and rounded shapes, and circular shapes are illustrated. However, other shapes of the cutouts 30 may be employed to produce a sequence of sections of differing aspect ratios to produce a distribution of magnetic field concentrations to produce a desired plasma density distribution. Elliptical, parabolic, or even partially broken line polygonal shapes can be use, for example, for the cut-outs. Not all cut-out patterns 30 of a given inductive element 20 need be the same, and combinations of patterns may be found most suitable for producing different plasma distributions.

The inductive element 20 as described above effectively creates multiple individual RF sources connected in series and carrying the equal RF current. The geometry and dimensions of the cut-out patterns 30 determine RF power to each individual source. For example, reduction of the RF current due to the transmission line effect can be adjusted by size of the portion removed for the cut-out 30 (as shown by dashed line 30a in FIG. 1A). The overall power distribution is determined by positions of the individual sources as determined by the locations and by aspect ratios of conductor segments 31-35 of the sheet that forms the element 20. The power level and effectiveness of the inductive coupling can further be influenced by the number of single strips of the conductor element 20 stacked perpendicularly to the dielectric chamber wall 16. Typically up to three or four stacked elements will be satisfactory.

The distribution and dimensions of cut-out patterns 30 can be designed to suit particular technology requirements, such as the size of the generated plasma, the power requirements, transmission line effect compensation, closure by the chamber wall, etc. The best way to evaluate appropriateness of the distribution of the cut-out patterns 30 is to use any one of a number of the 3D simulation software packages available on the market that generate power deposition into a plasma. However, some general rules may be applied to such design.

In the case of a planar configuration as illustrated in FIG. 1A, for an inductive device 20a with up to 300 mm outside diameter and operating within a typical RF power range of from 1 to 5 kW, the minimum width $W_{MIN}$ of the narrow portions W should be at least approximately 5-7 mm. Typical strip thickness T is about 1 to 3 mm. Material used to construct the inductive element 20 should have high conductivity, and for this copper is an acceptable choice, although other metals may be used, preferably with a silver coating, in which case, coating thickness of about 0.1 mm is typically sufficient for applied frequencies from the generator 18 that are above 450 kHz.

Figure 1D:
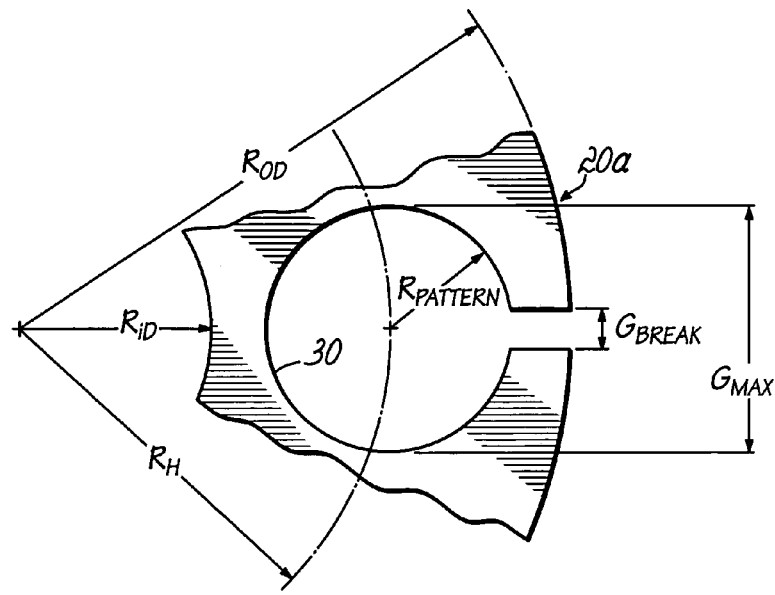
FIG. 1D is an enlarged drawing of a detailed common feature of the embodiments of FIGS. 1A-1C illustrating a minimum gap width, which may vary with performance and process parameters, and a maximum gap width, which is determined by geometric limitations.

Four or more cut-out patterns 30 typically provide sufficient distribution of the individual effective RF sources. The maximum number is limited by, for example, the radius $R_{PATTERN}$ of circular patterns 30, and the radial position $R_H$ of the patterns 30 within inductive element 20a. Generally, the radius $R_{PATTERN}$ of a circular cut-out portion should simultaneously satisfy the following two conditions:

$$R_{PATTERN} \leq \{(R_{OD}-R_{ID})/2\} - W_{MIN}$$

and $$R_{PATTERN} \leq R_H \sin(360/2N) W_{MIN}/2$$

where $R_{OD}$ and $R_{ID}$ are outside and inside radii respectively of the inductive device 20a, and $R_H$ is the radius of the centerline of the cutout patterns 30 in the sheet that forms the conductor of the element 20a. The $G_{BREAK}$ is a gap interrupting circumferential RF current paths in the conductor 20a, requiring the current to flow in a more complex path, with:

$$2 H_{WALL} \leq G_{BREAK} \leq 2 R_{PATTERN}$$

where $H_{WALL}$ is the dielectric window thickness. Accordingly, the gap width can vary from a certain minimum $G_{MIN}$, determined by performance parameters, to a certain maximum $G_{MAX}$, determined by geometrical limits, such as the diameter of the pattern 30, as illustrated in FIG. 1D.

To increase efficiency of the inductive device 20, several loops may be used. Typically two to four would be sufficient, but more than four may sometimes be practical. The induced voltage at such inductive device will increase moderately with its overall size, with a stronger dependence on overall size where the number of loops or the number of patterns is greater. There is proportional relation between induced voltage and operating frequency and RF current.

The inductive device 20 is connected to the rf power generator 18 through impedance matching network 17 according to principles generally known to those persons who are skilled in this art. At higher rf power applications, cooling of an inductive device by water flow using RF decoupling from grounded tap water is desirable.

Figure 2:
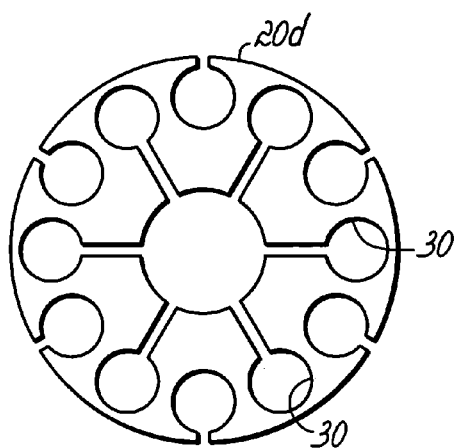
FIG. 2 is a top view diagram of a six-segment inductive element similar to the embodiment of FIG. 1A.
Figure 2A:
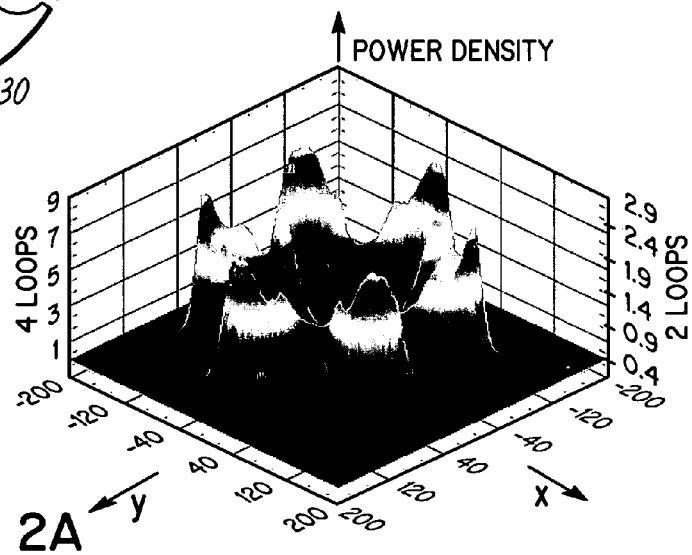
FIG. 2A is a perspective diagram of RF magnetic field power density distribution of embodiments of the element of FIG. 2 having four and two loops.
Figure 2B:
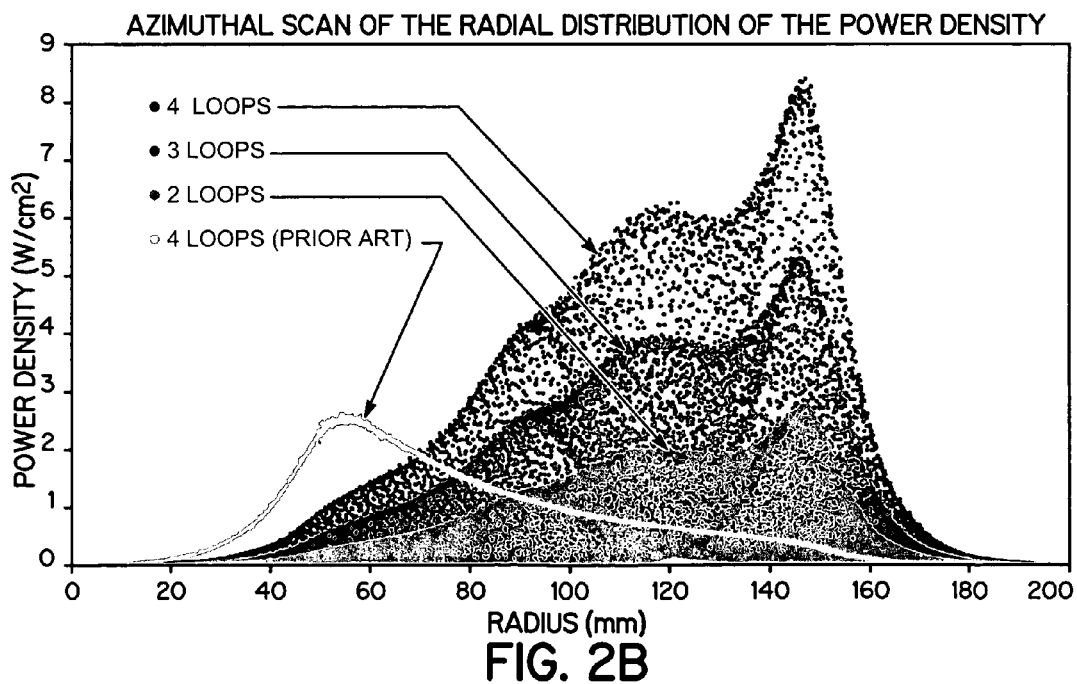
FIG. 2B is a graph comparing azimuthal scans of the radial distribution of the RF magnetic field power density for a prior-art, 4-turn, low-profile coil and six-segment inductive elements according to embodiments of the present invention having 2, 3 and 4 loops.

Examples of the use of the structure described above on plasma density distribution are set forth for inductive elements 20 in FIGS. 2, 3, 4, 5, and 6. For example, inductive element 20d is illustrated in FIG. 2, which is similar in configuration to 20a of FIG. 1A, but with 50% more cutouts 30 producing six segments. FIG. 2A shows the power density distribution for the inductive element 20d for two and four stacked loops. In FIG. 2B, the power density distributions in plasmas produced with inductive device 20d, in the cases of different numbers of stacked loops, are shown. Overall distribution is not changed using same six-segment inductive device, however, maximum power density is increased from 2.5 Wcm$^{-2}$ to 8.5 Wcm$^{-2}$ when increasing from 2 to 4 loops. Comparison to a prior-art 4 turn low profile coil, showing that, with the inductive device 20, the power density distribution in the plasma has a larger effective radius than in the case of the prior art low profile coil.

Figure 4E:
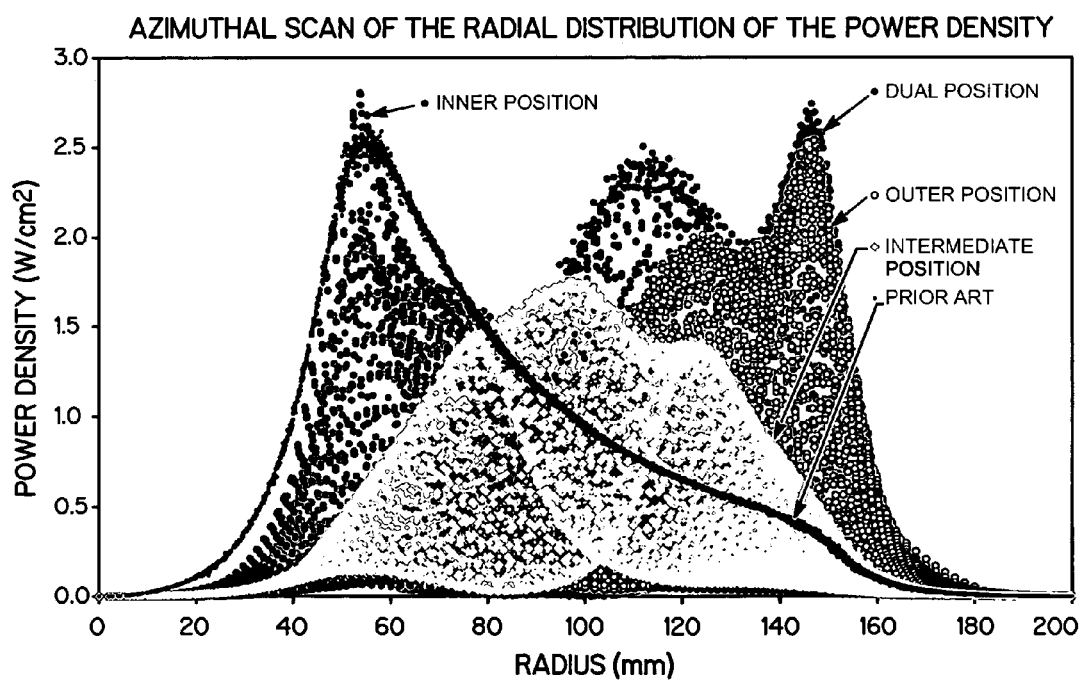
FIG. 4E is a graph comparing azimuthal scans of the radial distribution of the RF magnetic field power density for the prior art, 4-turn, low-profile coil and the segmented inductive elements according to embodiments of FIGS. 3A-3D.
Figure 3A:
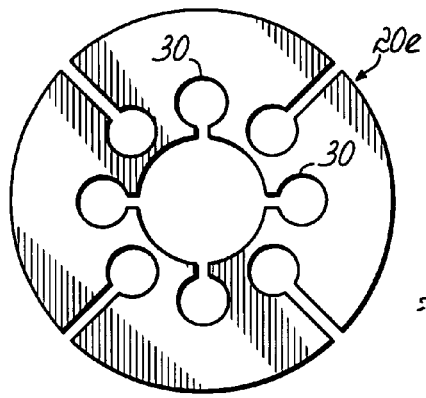
FIGS. 3A-3D are top view diagrams, similar to FIG. 2, of alternative embodiments of segmented inductive elements of "inside", "intermediate", "outside" and "dual" position patterns, respectively.
Figure 4A:
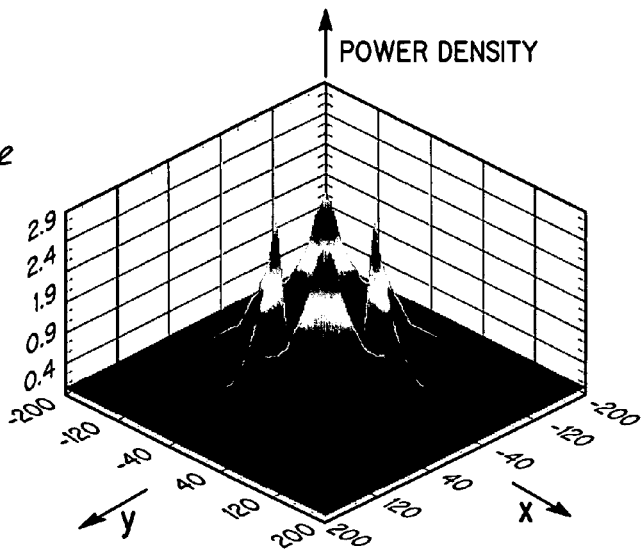
FIGS. 4A-4D are perspective diagrams of RF magnetic field power density distribution of embodiments of the elements of FIG. 3A-3D, respectively, for elements of 6 segments and 2 loops at a current of 10 amps and an excitation frequency of 13.56 MHz.
Figure 3B:
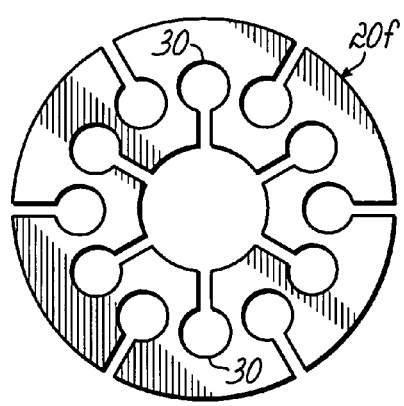
Figure 4B:
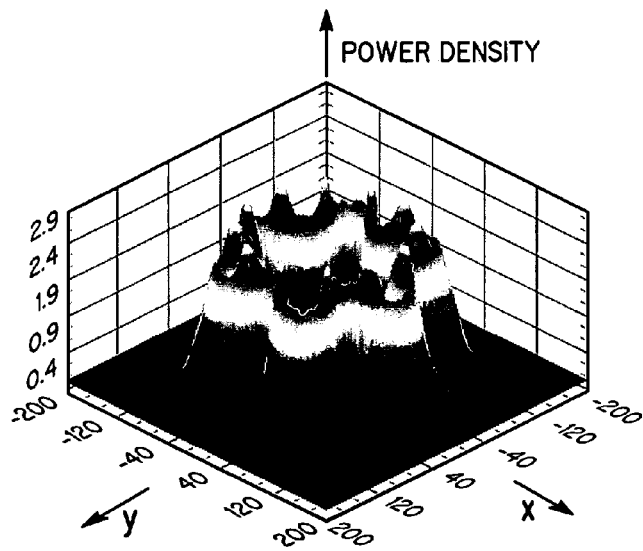
Figure 3C:
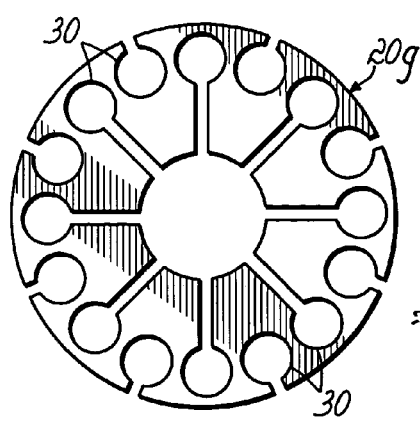
Figure 4C:
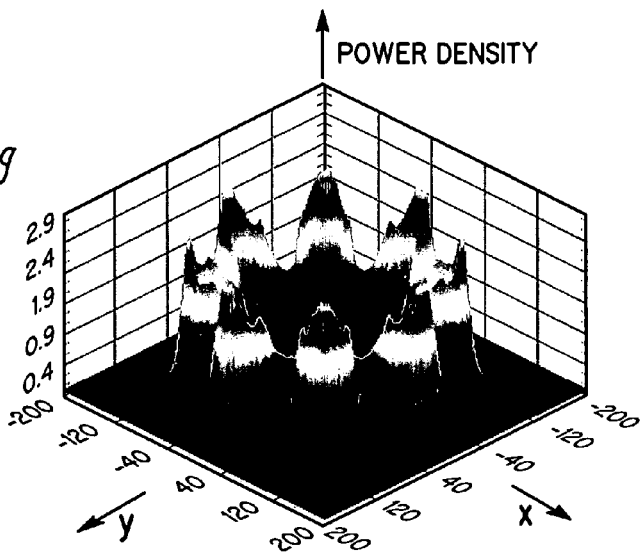
Figure 3D:
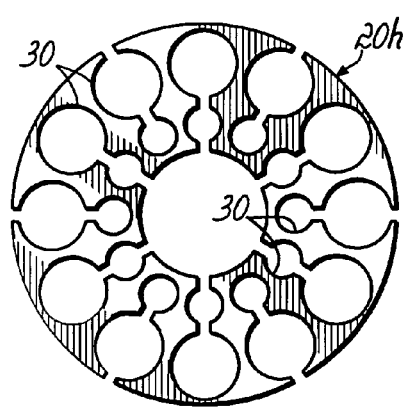
Figure 4D:
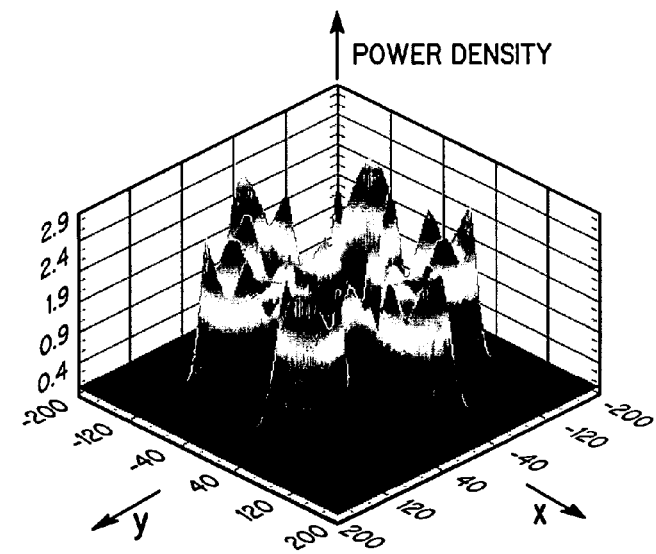

Further examples of the density distribution of power deposited into a plasma is illustrated in FIGS. 4A-4C for inductive devices 20e-20g of FIGS. 3A-3C, which are similar to device 20a of FIG. 4A, but having different cut-off patterns. The illustrations particularly show how control of the effective radius of the distribution is affected by such differences in pattern geometry. Azimuthal scans of the radial power density distribution for each individual case, also compared to the prior-art low profile coil, are shown in FIG. 4E. An inductive device 20h having more complex dual-radius pattern is shown in FIG. 3D with its plasma distribution shown in FIG. 4D, the azimuthal scan of the radial distribution of which is also similar to that shown in FIG. 4E.

The parameters and conditions for the inductive device 20e include four-segments, two-loops, 10 amps of current at 13.56 MHz, and an inside-radius pattern. The parameters and conditions for the inductive device 20f include six-segments, two-loops, 10 amps of current at 13.56 MHz, and an intermediate radius pattern. The parameters and conditions for the inductive device 20g include eight-segments, two-loops, 10 amps of current at 13.56 MHz, and an outside-radius pattern. And, the parameters and conditions for the inductive device 20h include six-segments, two-loops, 10 amps of current at 13.56 MHz, and a dual-radius pattern.

Similar Implementations for cylindrical geometry with cylindrical dielectric wall 16b shown in FIG. 1B can be provided by versions of inductive device 20b, which has the shape of a cylindrical surface and generates intense RF magnetic fields 41b. Similar approaches can be used for any other geometry, as in the case of conical or spherical shapes of FIG. 1C. Conductor 20c is congruently wrapped around the dielectric wall 16c, and generates intense RF magnetic fields 41c inside the vacuum chamber 12.

Figure 5:
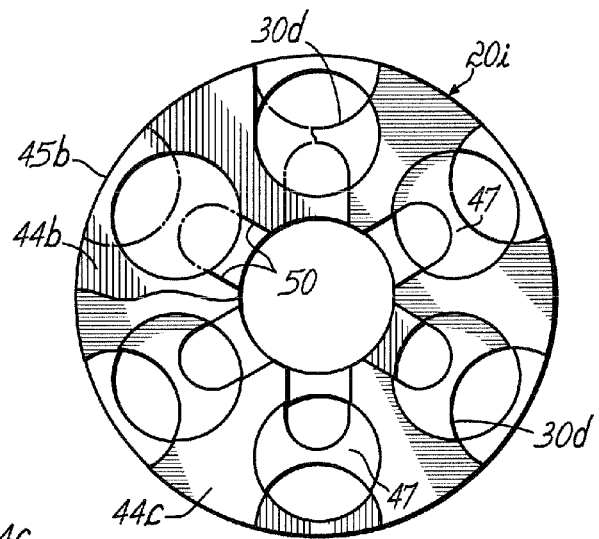
FIG. 5 is a top view diagram, similar to FIG. 2, of another segmented inductive element having 3 vertically stacked loops, 6 segments, coplanar geometry and radially distributed low aspect ratio conductors.
Figure 5A:
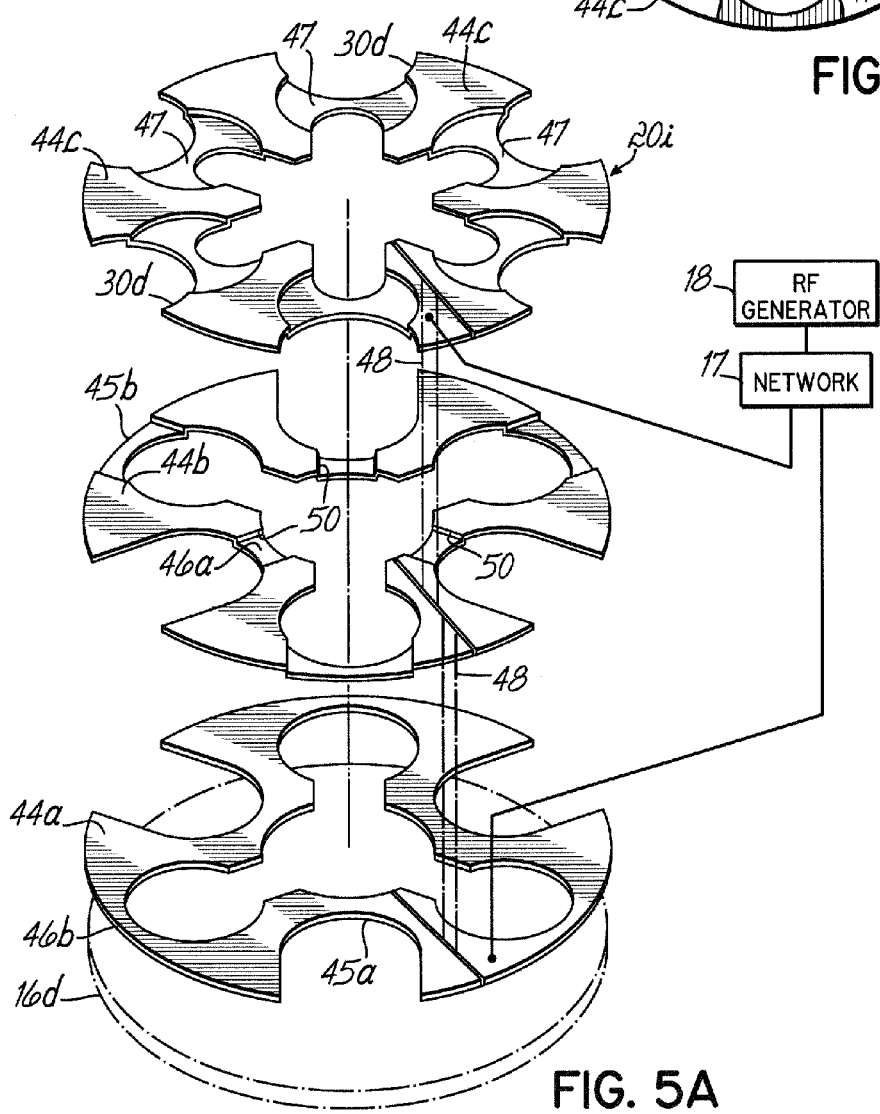
FIG. 5A is a perspective, disassembled, partially cut-away diagram of the inductive element of FIG. 5.

In a stacked configuration, the shape of the individual patterns 30 in different loops can be adjusted to create low aspect ratio conductors from different loops to be at the same distance from the dielectric wall 16, but having different radial distance from the center axis of the inductive element 20. The Inductive device 20i illustrated in FIGS. 5-5A has three loops 44a-c placed against a window 16d. In the case of the six-segmented inductive device 20i, the loop 44b is rotated for 60 degrees in relation to the loop 44a, creating inner and narrow sections 45a and 46a that are positioned at the same radius but are of different loops. Similarly, outer and narrow sections 45b and 46b of the inductive device 20i that are positioned at the same but a larger radius, are of different loops. The third loop 44c has a cut-off pattern 30d both at the inner and outer edge of the high aspect ratio portion of the conductor 20i, and narrow sections 47 are thereby created at an intermediate radius. The loops 44a-c are connected in series by connections 48. The device 20i is powered by RF generator 18 through the matching network 17 according to principles known to those skilled in the art.

Figure 5B:
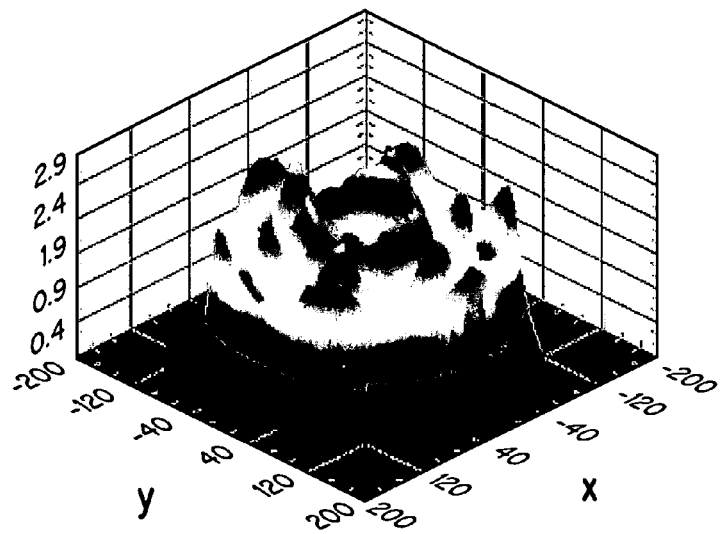
FIG. 5B is a perspective diagram of the RF magnetic field power density distribution at the plasma surface of the inductive element of FIGS. 5 and 5A, at a current of 10 amps, an excitation frequency of 13.56 MHz, and an inductance of approximately 0.81 microHenry.
Figure 5C:
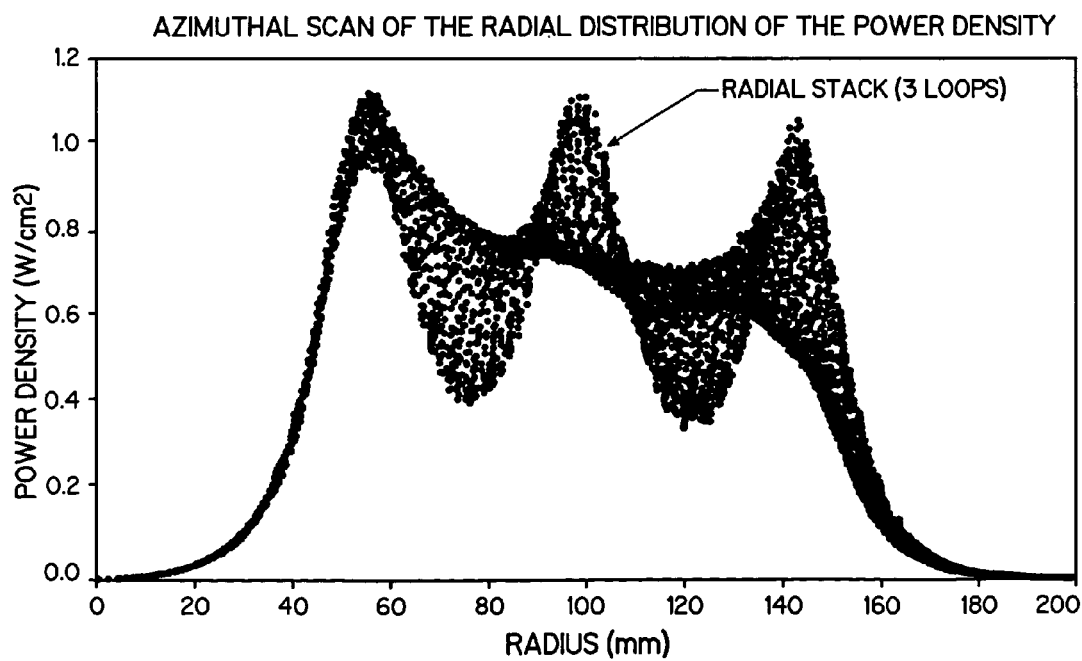
FIG. 5C is a graph of an azimuthal scan of the radial distribution of the RF magnetic field power density for the inductive element of FIGS. 5 and 5A.

The resulting RF power density distribution for the inductive device 20i has multiple peaks positioned at three different radii and rotated at 60 degrees around the vertical axis, as illustrated in FIGS. 5B and 5C. The distribution is represented by a wide annular profile with peaks of approximately equal magnitude across its width. The estimated inductance of such an inductive device 20i having a diameter 300 millimeters is about 0.81 microHenry. The width of the low aspect ratio conductor lines 45a, 45b, 46a, 46b and 47 can be radially determined to control or adjust for required plasma density distribution in the chamber. There is wide flexibility in the geometry design to affect magnitude and location of the increased power deposition into the plasma using principles of the invention. The gap between two consequent loops is in a range of from several to approximately 20 mm. To provide conditions for maximum power delivery into the plasma, the narrow sections should be close to the dielectric window, thus more distanced loops in stacked configuration should be formed with steps 50 toward the window. In analogy to the radial variations, the shapes of the individual patterns in different loops can be adjusted to be at approximately the same or different radial distances from the center, but having different azimuthal position within different loops.

Figure 6:
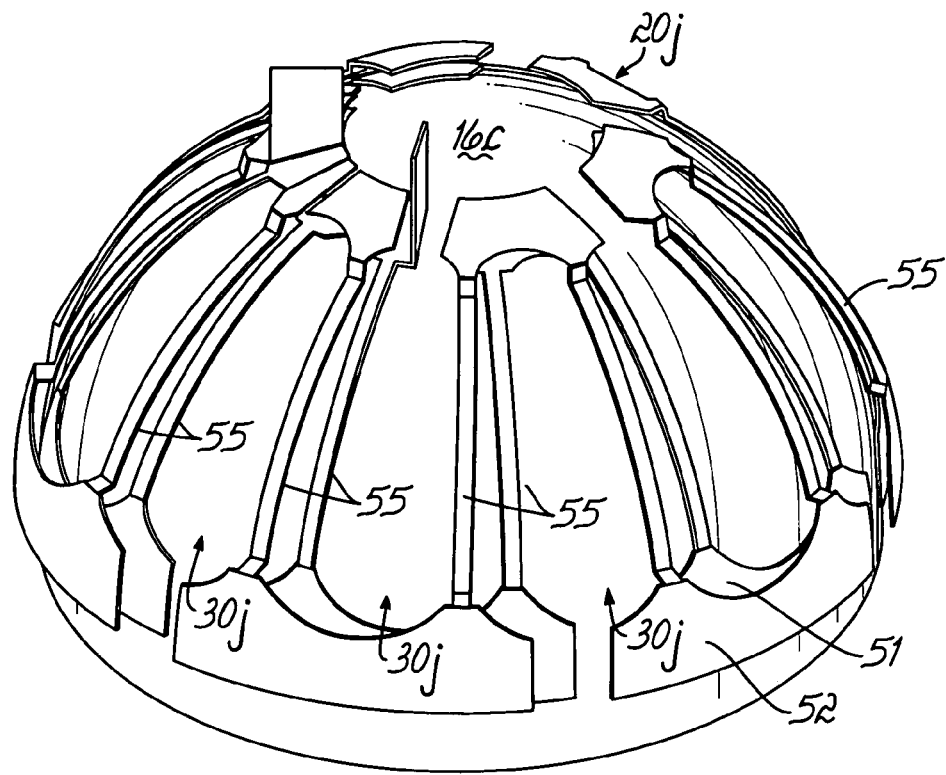
FIG. 6 is a perspective diagram of a two-loop, hemispherical segmented inductive element according to principles of the present invention.
Figure 6A:
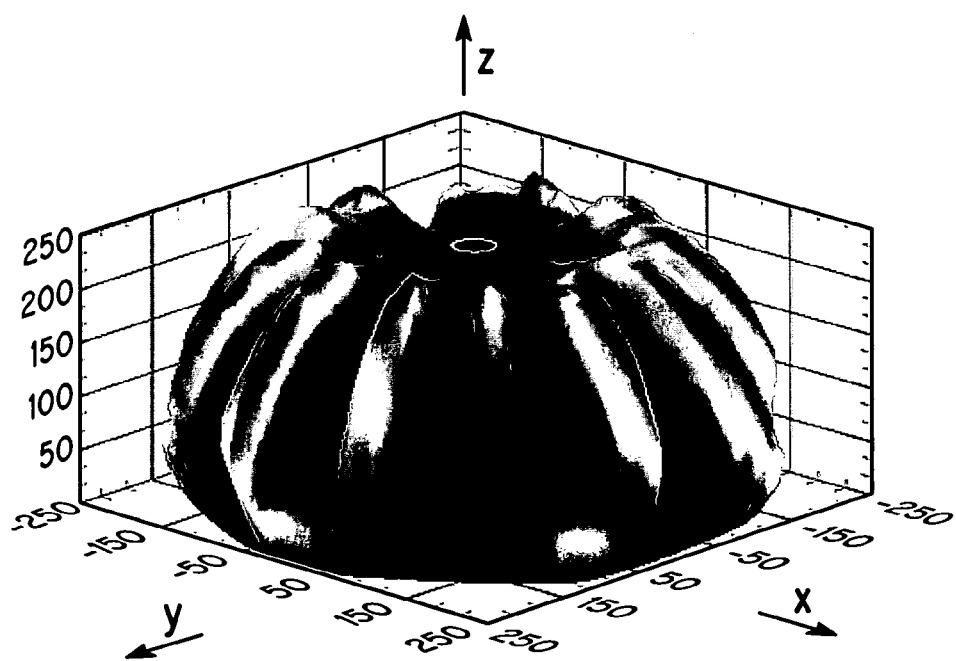
FIG. 6A is an RF magnetic field power density distribution for the inductive element of FIG. 6 at a current of 10 amps, and an excitation frequency of 13.56 MHz.

FIG. 6 shows another example of a hemispherical chamber wall 16c of FIG. 1C, using an inductive element 20j, which may have two or more layers configured in variations described in the embodiments above. The element 20j is illustrated as having two layers, including a first loop structure 51 close to the wall 16c and a second loop structure 52 rotated in relation to the first structure 51 to create azimuthally multiple conductors congruent with the dielectric wall 16c. Non-circular cut-off portions 30j are employed. The RF current in the antenna conductors is illustrated by arrows 55. The power density distribution for the conductor 20j, with current at 10 amps and frequency at 13.56 MHz, is illustrated in FIG. 6A.

Embodiments of the invention provide benefits that include (a) spatially distributed RF power deposited into the plasma, (b) radial and/or azimuthal plasma uniformity improvement, (c) power from single RF supply, (d) large area plasma sources application, (d) low inductance, and (e) design flexibility to adjust to any of a wide range of power distributions.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. A plasma processing apparatus comprising:
a vacuum processing chamber having a substrate support therein centered on a central axis of the chamber;
a chamber wall enclosing a plasma processing space within the chamber proximate the substrate support, the chamber wall having a dielectric window therein centered on the central axis, the dielectric window having a vacuum chamber side and an outside;
an ICP source coupled to the chamber, the source including an RF power source outside of the chamber and means for coupling RF energy from the RF power source into the plasma processing space within the chamber in a spatially distributed ring, around and centered on the axis, in an alternating high and low plasma density distribution;

the means for coupling including an inductor outside of the chamber having a conductor formed of a sheet of electrically conductive material in the shape of at least one loop having opposite edges encircling the axis, the sheet having a gap extending between the opposite edges and defining a pair of terminal ends connected to the RF power source;

the opposite edges including an inner edge and an outer edge each having a plurality of cutouts therein, including inner cutouts in the inner edges and outer cutouts in the outer edges alternately spaced around the axis, that require RF current flowing between the terminal ends to flow around the outside of the inner cutouts and to flow around the inside of the outer cutouts, so as to concentrate near the cutouts RF magnetic fields extending into the plasma processing space to energize segments of high plasma density in the processing space in the alternating high and low plasma density distribution;

the cutouts in the outer edge extending sufficiently radially inward to interrupt the shortest current paths around the outside of the cutouts in the inner edge and the cutouts in the inner edge extend sufficiently radially outward to interrupt the shortest current paths around the inside of the cutouts in the outer edge;

the opposite edges thereby defining a sinuous serpentine conductive path that alternately curves inwardly around the outside of the cutouts in the inner edge and curves outwardly around the inside of the cutouts in the outer edge, in a plurality of oscillations between the terminal ends;

the at least one loop including a series of segments of alternating large and small cross-sections having widths generally parallel to the dielectric window and thicknesses generally perpendicular to the dielectric window.

2. The apparatus of claim 1 wherein:
the spatially distributed ring of RF energy in the alternating high and low plasma density distribution includes inductively coupled energy from the small cross-section segments of the inductor into the segments of high plasma density in the processing space.

3. The apparatus of claim 1 wherein:
the spatially distributed ring of RF energy in the alternating high and low plasma density distribution includes inductively coupled energy from the small cross-section segments of the inductor into the segments of high plasma density in the processing space in a plurality of rings having different radii from an axis of the chamber.

4. The apparatus of claim 1 wherein:
the cutouts are distributed in the material in an array defining the large and small cross-section segments of the inductor.

5. The apparatus of claim 1 wherein:
the cutouts are distributed in the material in a circular array of alternating inner and outer cutouts, spaced at equal angular intervals around the axis.

6. The apparatus of claim 1 wherein:
the cutouts are distributed in the material in an array of alternating inner and outer cutouts, spaced around the axis, with the shortest distance between adjacent inner and outer cutouts defining the small cross-section segments of the loop of the inductor.

7. An ICP source for a processing apparatus comprising:
an RF power source;
a dielectric window forming part of a chamber wall and having a vacuum chamber side and an outside; and
means for coupling RF energy from the RF power source into a plasma processing space within the chamber in a spatially distributed ring in an alternating high and low plasma density distribution;

the means for coupling including an electrical-circuit inductor on the outside of the dielectric window and generally congruent to the dielectric window, and a pair of terminal ends at opposite ends of the conductor, each terminal end having an RF connector fixed thereto coupling the conductor to the RF power source;

the inductor including an electrical conductor in the shape of at least one loop having a pair of opposite edges encircling an axis and providing a sinuous, oscillating, serpentine path around the axis that is between and defined by the opposite edges;

the opposite edges including an inner edge and an outer edge, each edge having a plurality of cutouts therein, alternately spaced in the inner and outer opposite edges, that require RF current flowing between the terminal ends to flow in an outwardly curving path segment around the outside of the cutouts in the inner edge and in an inwardly curving path segment around the inside of the cutouts in the outer edge so as to thereby concentrate magnetic flux around the conductor at the cutouts and extending through the dielectric window into the processing space to produce the plasma in the processing space within the chamber in the alternating high and low plasma density distribution.

8. The ICP source of claim 7 wherein:
the cutouts in the outer edge extend sufficiently radially inward to interrupt the shortest current paths around the outside of the cutouts in the inner edge; and
the cutouts in the inner edge extend sufficiently radially outward to interrupt the shortest current paths around the inside of the cutouts in the outer edge.

9. The ICP source of claim 7 wherein:
the conductor includes a series of lengths of alternating large and small cross-sections and widths;
the cutouts in the outer edge extend sufficiently radially inward to interrupt the shortest current paths around the outside of the cutouts in the inner edge; and
the cutouts in the inner edge extend sufficiently radially outward to interrupt the shortest current paths around the inside of the cutouts in the outer edge.

10. The ICP source of claim 7 wherein:
the conductor includes a series of lengths of alternating large and small cross-sections and widths, the widths being generally parallel to the dielectric window.

11. The source of claim 10 wherein:
the cutouts are distributed in the material in a circular away of alternating inner and outer cutouts, spaced at equal angular intervals around the axis.

12. The source of claim 10 wherein:
the cutouts are distributed in the material in an away of alternating inner and outer cutouts, spaced around the axis, with the shortest distance between adjacent inner and outer cutouts defining the small cross-section segments of the loop of the inductor.

13. An ICP apparatus comprising the ICP source of 7 and further comprising:
a vacuum processing chamber having a chamber wall having the dielectric window therein; and
the inductor being outside of the chamber.

14. An ICP source comprising:
an inductor having a conductor formed of a sheet of electrically conductive material in the shape of at least one loop having opposite edges encircling an axis, the sheet having:
  a gap extending between the opposite edges and defining a pair of terminal ends, and
  a pair of RF connectors, one fixed to each of the terminal ends; and
the opposite edges including an inner edge and an outer edge, each having a plurality of cutouts therein that require RF current flowing between the terminal ends to flow around the outside of the cutouts in the inner edge and around the inside of the cutouts in the outer edge, wherein:
the cutouts are alternately spaced in the inner and outer opposite edges,
the cutouts in the outer edge extend sufficiently radially inward to interrupt the shortest current paths around the outside of the cutouts in the inner edge,
the cutouts in the inner edge extend sufficiently radially outward to interrupt the shortest current paths around the inside of the cutouts in the outer edge;
the opposite edges thereby define a sinuous serpentine conductive path that alternately curves inwardly around the outside of the cutouts in the inner edge and curves outwardly around the inside of the cutouts in the outer edge, in a plurality of oscillations between the terminal ends; and
the at least one loop includes a series of segments of alternating large and small cross-sections and widths, the cutouts being distributed in an away of cutouts in alternate inner and outer edges around the axis, with the shortest distance between adjacent cutouts defining the small cross-section segments of the loop;
an RF power source connected across the ends of the conductor;
a dielectric window having a vacuum chamber side and an outside;
the inductor being outside of the dielectric window, generally congruent thereto, the widths being generally parallel to the dielectric window; and
means, including said inductor, for coupling RF energy through the dielectric window to form a plasma in a chamber having an alternating ring of high and low power density segments in the chamber, with the small cross-section segments of the loop coupling energy into the high power density segments of the plasma and the large cross-section segments of the loop coupling energy into the low power density segments of the plasma.

* * * * *

UNITED STATES PATENT AND TRADEMARK OFFICE
CERTIFICATE OF CORRECTION

PATENT NO.      : 7,464,662 B2                                          Page 1 of 1
APPLICATION NO. : 10/766505
DATED           : December 16, 2008
INVENTOR(S)     : Jozef Brcka It is certified that error appears in the above-identified patent and that said Letters Patent is hereby corrected as shown below:

In Column 3, line 53, "of FIG. 3A-3D," should read --of FIGS. 3A-3D,--.
In Column 5, line 54, "shapes can be use," should read --shapes can be used,--.

In Column 6, line 64, "connected to the rf power" should read --connected to the RF power--.
In Column 6, line 67, "At higher rf power" should read --At higher RF power--.

In Column 7, line 13, "changed using same" should read --changed using the same--.
In Column 7, line 44, "Similar Implementations" should read --Similar implementations--.
In Column 7, line 58, "The Inductive device" should read --The inductive device--.

In Column 8, line 46, "(d) low inductance, and (e) design" should read --(e) low inductance, and (f) design--.

In Claim 11, Column 10, line 54, "in a circular away" should read --in a circular array--.
In Claim 12, Column 10, line 58, "in an away of" should read --in an array of--.

In Claim 14, Column 12, line 6, "in an away of" should read --in an array of--.

Signed and Sealed this

Twenty-fourth Day of November, 2009

David J. Kappos
*Director of the United States Patent and Trademark Office*